(12) United States Patent
Yin

(10) Patent No.: US 6,888,418 B2
(45) Date of Patent: May 3, 2005

(54) CONTROL CIRCUIT AND METHOD FOR A CRYSTAL OSCILLATOR USING A TIMER

(75) Inventor: Rong Yin, Coppell, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/603,281

(22) Filed: Jun. 24, 2003

(65) Prior Publication Data

US 2004/0263271 A1 Dec. 30, 2004

(51) Int. Cl.[7] .................................................. H03B 5/32
(52) U.S. Cl. ..................... 331/158; 331/116 R; 331/185
(58) Field of Search ......................... 331/158, 116 R, 331/175, 177 R, 185, 34, 160, 116 FE

(56) References Cited

U.S. PATENT DOCUMENTS

| | | | |
|---|---|---|---|
| 5,923,838 A | * | 7/1999 | Hongo .......................... 714/42 |
| 6,313,712 B1 | * | 11/2001 | Mourant et al. ........ 331/116 FE |
| 6,563,391 B1 | * | 5/2003 | Mar ........................ 331/116 R |
| 6,727,769 B2 | * | 4/2004 | Aihara et al. ................ 331/158 |
| 6,741,137 B1 | * | 5/2004 | Sibrai et al. ................. 331/109 |
| 2003/0132741 A1 | * | 7/2003 | Senthilkumar et al. ...... 324/100 |

* cited by examiner

*Primary Examiner*—Robert Pascal
*Assistant Examiner*—Joseph Chang
(74) *Attorney, Agent, or Firm*—Lisa K. Jorgenson; Andre Szuwalski

(57) ABSTRACT

A circuit and method are disclosed for controlling current dissipated by an oscillator circuit. The circuit includes a current source adapted to source current to or sink current from the oscillator circuit. A control circuit is adapted to count a predetermined period of time following the occurrence of an event, such as completion of a power-up operation. An output of the control circuit, having a value indicative of whether the predetermined period of time has elapsed, is coupled to a control input of the current source. In this way, the output of the control circuit sets a current level sourced to or sunk from the oscillator circuit by the current source.

24 Claims, 2 Drawing Sheets

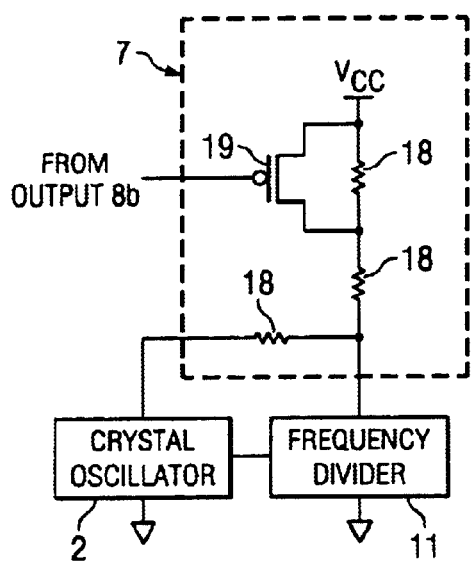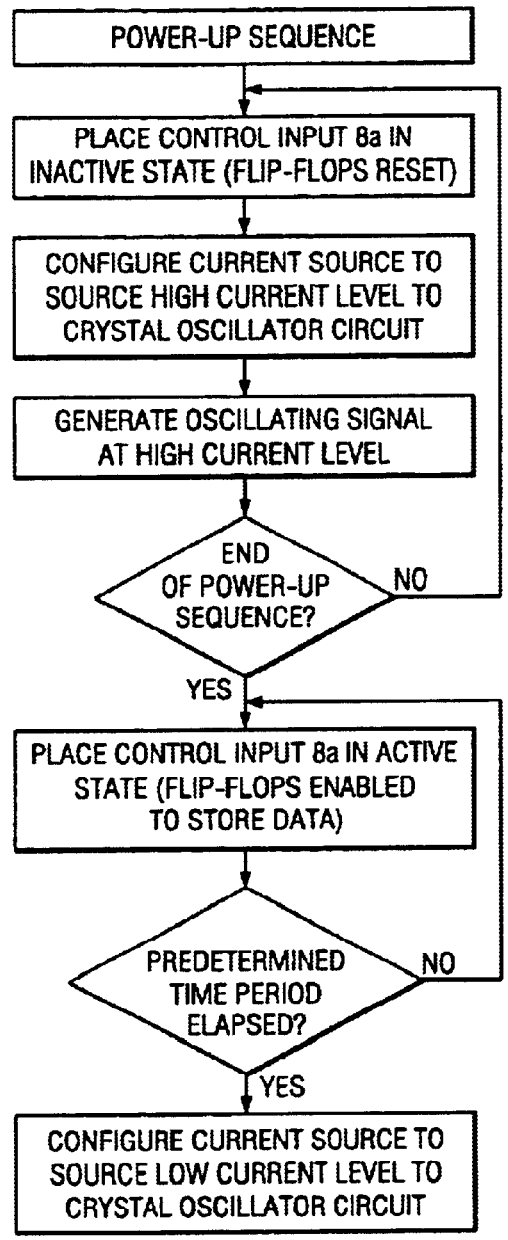

CONTROL CIRCUIT AND METHOD FOR A CRYSTAL OSCILLATOR USING A TIMER

BACKGROUND OF THE INVENTION

1. Technical Field of the Invention

The present invention relates to oscillator circuitry, and particularly to circuitry for controlling current dissipated by crystal oscillator circuits.

2. Description of the Related Art

Crystal oscillators have been used in the electronics industry for decades for providing a clock or other signal having a fixed, predetermined frequency. For certain applications, some existing crystal oscillator circuits operate at relatively low voltage and low current levels. However, these low voltage, low current oscillator circuits take an appreciably long time to start up and stabilize. Oscillator circuits having a relatively prolonged time to start-up and stabilize adversely affect normal system operation as well as testing of the circuitry associated with the oscillator circuits.

At least one existing oscillator circuit design allows for higher current dissipation by the oscillator when initially started, and thereafter switches the oscillator current to a lower current level. This existing oscillator circuit utilizes an amplitude detector to detect current level consumed by the oscillator circuit and to provide feedback to the current source providing current to the oscillator circuit based upon the current detected. A problem with this existing oscillator circuit, however, is that it results in a rather complex circuit design. What is needed, then, is an oscillator circuit that quickly starts and stabilizes with little overhead.

SUMMARY OF THE INVENTION

Embodiments of the present invention overcome the above-discussed shortcomings with existing oscillator circuits and satisfy a significant need for an oscillator circuit that quickly and stably commences oscillating. According to an exemplary embodiment of the present invention, oscillator circuitry may include a crystal oscillator circuit adapted to oscillate at approximately a predetermined frequency, and a control circuit that controls the amount of current dissipated by the crystal oscillator circuit. The control circuit may include a timer circuit for counting a predetermined period of time following the occurrence of an event, such as completion of a power-up sequence. Upon completion of the predetermined period of time, the timer circuit controls a current source providing current to the crystal oscillator circuit to source a current level thereto that is less than the current level initially sourced to the crystal oscillator circuit. In this way, the crystal oscillator circuit is capable of quickly and stably commencing oscillating with little overhead, while dissipating relatively little power.

BRIEF DESCRIPTION OF THE DRAWINGS

A more complete understanding of the system and method of the present invention may be obtained by reference to the following Detailed Description when taken in conjunction with the accompanying Drawings wherein:

FIG. 3 is a circuit diagram of a portion of the oscillator circuitry of FIG. 1, according to another exemplary embodiment of the present invention; and FIG. 4 is a flow chart illustrating an operation of the oscillator circuitry of FIG. 1.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
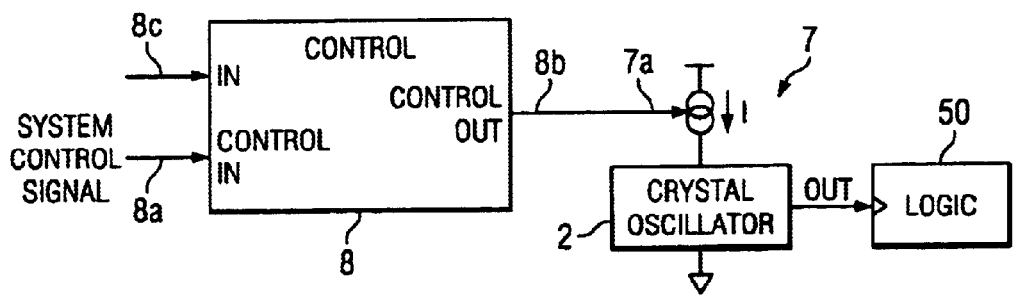
FIG. 1 is a block diagram of oscillator circuitry according to an exemplary embodiment of the present invention.

Referring to FIG. 1, there is shown oscillator circuitry 1 that relatively quickly begins oscillating in a stable manner, according to an exemplary embodiment of the present invention. Oscillator circuitry 1 is adapted to control current dissipation so that oscillation initially occurs at a first current level followed by oscillation at a second current level that is less than the first current level. Oscillator circuitry 1 may be part of a system 100 that may further include logic circuitry 50 which receives the output of oscillator circuitry 1 and is adapted to perform one or more predetermined operations from utilization of the output of oscillator circuitry 1. For example, logic circuitry 50 may perform one or more synchronous operations by using the output of oscillator circuitry 1 as a clock signal.

Specifically, oscillator circuitry 1 may include a crystal oscillator circuit 2 adapted to generate an output signal that oscillates at approximately a predetermined frequency. Crystal oscillator circuit 2 may have a conventional implementation for a crystal oscillator, and include a crystal 3, a logic inverter 4 connected across the terminals of crystal 2, and a pair of capacitors 5 (see FIG. 2). Each capacitor 5 may be coupled between a distinct terminal of crystal 2 and a voltage reference, such as ground. The operation of the above-described conventional crystal oscillator circuit 2 is known in the art and will not be described in detail for reasons of simplicity.

It is understood that crystal oscillator circuit 2 may have different circuit implementations. It is further understood that crystal oscillator circuit 2 may include or be otherwise associated with additional circuitry not shown in FIG. 1, such as a frequency divider circuit that generates a signal having a frequency that is a fraction of the frequency at which crystal oscillator circuit 2 oscillates. Alternatively, oscillator circuitry 1 may include other oscillator circuits and/or components that do not utilize a crystal.

Oscillator circuitry 1 may further include a current source 7 that provides current to or sinks current from crystal oscillator circuit 2. Current source 7 may have any of a plurality of implementations, as described below. Current source 7 may include a control input 7a utilized to control the amount of current sourced by or sunk from current source 7.

Oscillator circuitry 1 may further include a control circuit 8 that controls current source 7 and thereby controls the current that is sourced to or sunk from crystal oscillator circuit 2. According to an exemplary embodiment of the present invention, control circuit 8 may receive a control input 8a having a value indicative of the occurrence of an event, and an output 8b coupled to the control input 7a of current source 7 for use in controlling the amount of current dissipated by crystal oscillator circuit 2. Control circuit 8 may include timing circuitry for causing current source 7 to switch from a higher current level to a lower current level a period of time following the occurrence of an event.

Figure 2:
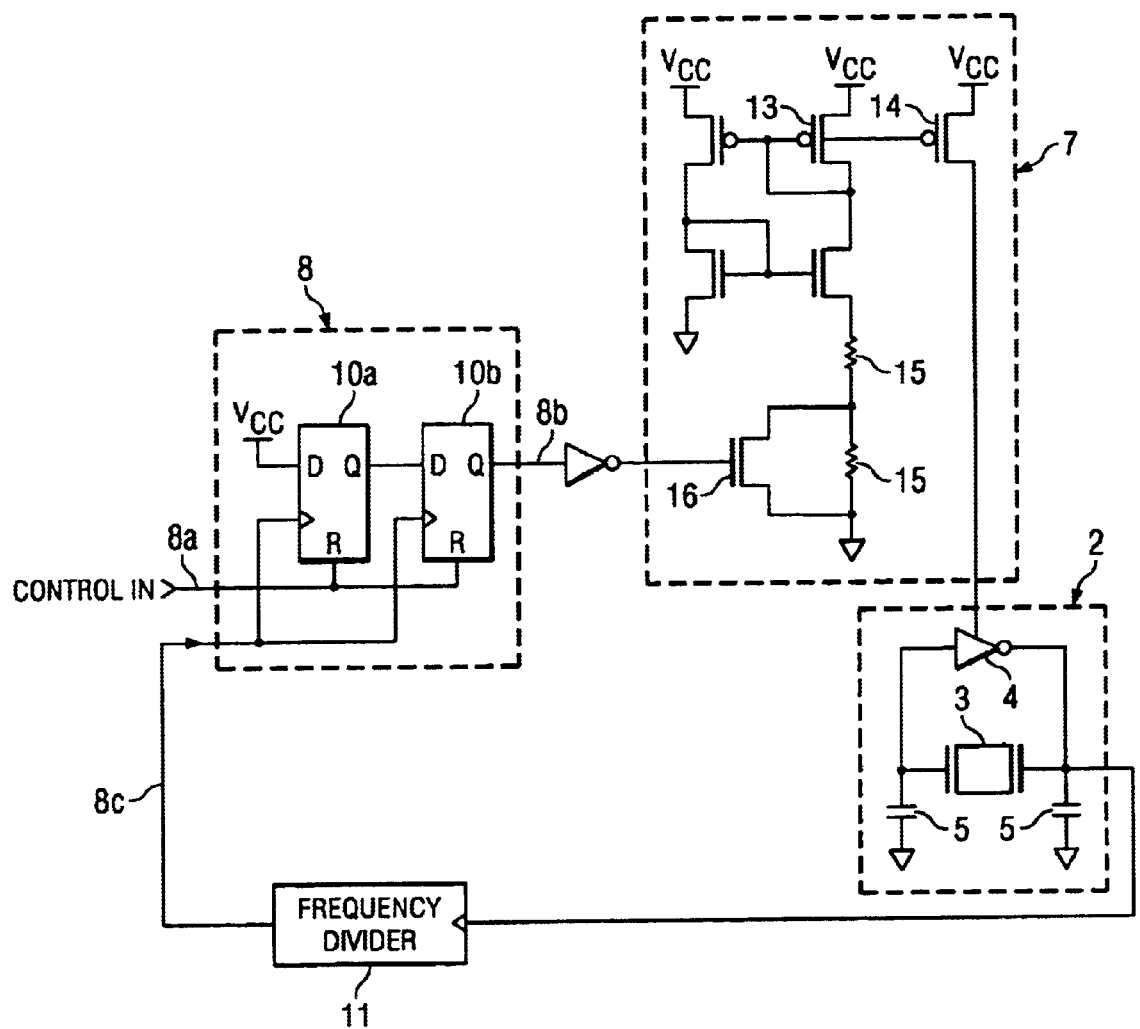
FIG. 2 is a circuit diagram of the oscillator circuitry of FIG. 1.

With reference to FIG. 2, control circuit 8 may include a timer circuit adapted to count a predetermined number of cycles appearing on a signal applied to a clock input 8c of control circuit 8. In an exemplary embodiment of the present invention, the timer circuit may include at least two flip-flop circuits 10 connected in cascade relation so that an output of a first flip-flop 10a is coupled to the data input of a second flip-flop 10b. The output 8b of control circuit 8 may be coupled to an output of flip-flop 10b. The clock input of each flip-flop 10 may be coupled to the clock input 8c of control circuit 8. In this way, the output of flip-flop 10b may follow the logic value provided to the data input of flip-flop 10a, delayed by two cycles of the clock input 8c.

A data input of flip-flop circuit 10a may be coupled to a voltage potential representative of a predetermined logic level, such as power supply Vcc (representative of a logic high value). Flip-flop circuits 10 may also include a control input for placing the flip-flops 10 in one or more predetermined states. In the exemplary embodiment of the present invention shown in FIG. 2, the control input of flip-flop circuits 10 may be a reset input to selectively reset flip-flops 10. Alternatively, the control input of flip-flops 10 may set flip-flops 10 to one or more other states, such as a set state. In this alternative embodiment in which flip-flops 10 have set inputs, the data input of flip-flop 10a may be coupled to a voltage level representative of a logic low value, such as ground.

As mentioned above, control circuit 8 may control current source 7 to selectively change current provided to or sunk from crystal oscillator circuit 2 from a first current level to a second current level, following the occurrence of an event. In particular, the control input 8a of control circuit 8 may receive a signal having a value indicative of the occurrence of the event. The event may be, for example, the completion of a start-up sequence by the system which utilizes the output of crystal oscillator circuit 2. In this regard, the control input 8a of control circuit 8 may be driven by power-on-reset circuitry of the system. Alternatively, the event may be the system switching from one power source to another, such as switching to a battery back-up source. In this way, the control input 8a of control circuit 8 may be driven by a signal indicating the system being in the battery back-up mode of operation. It is understood that the event, and thus the circuit that drives the control input 8a of control circuit 8, may be other events as well.

The signal applied to the clock input 8c of control circuit 8 may have a frequency that allows for a desired predetermined period of time to elapse. Of course, the frequency of the signal appearing on clock input 8c and the number of cascaded flip-flops 10 in the timer circuit may be selected to provide the predetermined time period desired. In an exemplary embodiment of the present invention, the clock input 8c of control circuit 8 may be a divided-down version of the output of crystal oscillator 2. A frequency divider 11, may receive as a (clock) input the output of crystal oscillator 2 and generate an output signal having a divided-down frequency thereof that is applied to the clock input 8c of control circuit 8. By way of one example, the signal appearing at the clock input 8c of control circuit 8 may be approximately 1 Hz, which thereby results in the timer of control circuit 8 having a delay of approximately two seconds (for a two flip-flop timer).

FIG. 2 also shows one possible implementation of current source 7. Current source 7 may be implemented as a current mirror circuit including a first current leg 13 and a second current leg 14 adapted to source current to crystal oscillator circuit 2. First current leg 13 may include one or more series-connected resistive elements 15 and a transistor 16 coupled across at least one of the resistive elements 15. The transistor 16 may include a control (gate) terminal coupled to the output 8b of control circuit 8 via a logic inverter. Activation of transistor 16 by control circuit 8 shorts the voltage across the corresponding resistive element 15 so as to change (increase) the current level of current leg 13, which thereby proportionally changes (increases) the current in current leg 14. In this way, control circuit 8 is capable of setting the current level of crystal oscillator circuit 2 to any of at least two current settings.

It is understood that current source 7 may be implemented in other ways. FIG. 3 shows another possible implementation of current source 7 and its relationship with control circuit 8 and crystal oscillator circuit 2. In this exemplary embodiment, current source 7 is implemented as a number of series-connected resistive elements 18 coupled between a voltage source, such as Vcc, and crystal oscillator circuit 2. A transistor 19 may be coupled across at least one of the resistive elements 18 and include a control terminal coupled to the output 8b of control circuit 8. Activation of transistor 19 shorts the voltage across the corresponding resistive element 18 so as to change (increase) the current level to crystal oscillator circuit 2. In this way, control circuit 8 is capable of setting the current level of crystal oscillator circuit 2 to any of two current settings.

It is understood that the current source may be implemented in a number of ways that are different from the implementations shown in FIGS. 2 and 3.

The operation of oscillator circuitry 1 will be described with reference to FIG. 4. The exemplary embodiment of oscillator circuitry 1 whose operation will be described is the one which is responsive to a power-up sequence. Initially, the power-up sequence is started. The power-up sequence may include ramping up the supply voltage Vcc from a ground potential to the desired power supply voltage level. during this time, control input 8a, which may be driven by power-on-reset circuitry of the system in which oscillator circuitry 1 is located, may be placed in an inactive state so that flip-flops 10 are reset. Flip-flops 10 being reset causes output 8b to be in the logic low state which turns on transistor 16. Transistor 16 being activated results in a relatively high current level flow through the first current leg 13 in current source 7, which thereupon causes a relatively high current level flow through current leg 14. As a result, a relatively high current level is sourced to crystal oscillator circuit 2. During this time, frequency divider 11 generates an output signal having a frequency that is divided-down from the frequency at which crystal oscillator circuit 2 oscillates.

Upon completion of the power-up sequence, control input 8a is driven to the active state so that flip-flops 10 are capable of storing data. A logic high value is stored in flip-flop 10a following a triggering edge of the signal generated by frequency divider 11. Logic high values are stored in both flip-flops 10 following the second triggering edge of the signal generated by frequency divider 11 (i.e., the occurrence of the predetermined period of time following the completion of the power-up sequence). At that time, the output 8b of control circuit 8 changes from a logic low state to a logic high state, which causes transistor 16 to turn off. Transistor 16 turning off causes the current level in current leg 13 of current source 7 to lower, which thereupon causes the current level in current leg 14 to lower proportionally. Crystal oscillator circuit 2 oscillates at the lower current level as a result.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An oscillator circuit, comprising:
   a crystal oscillator circuit adapted to oscillate at approximately a predetermined frequency; and
   a control circuit coupled to the crystal oscillator circuit for controlling a current level at which the crystal oscillator circuit operates, the control circuit selectively switching the current level from a first current level to a second current level different from the first current level in response to a timer circuit which measures a predetermined period of time following an occurrence of an event.

2. The oscillator circuit of claim 1, wherein:
   the timer circuit is capable of counting a predetermined period of clock pulses applied to the timer circuit.

3. The oscillator circuit of claim 2, wherein:
   the timer circuit includes a control signal and the timer circuit may be placed in a predetermined state upon the control signal being in a certain logic state.

4. The oscillator circuit of claim 1, wherein the timer circuit comprises:
   at least two flip-flop circuits, at least one of the at least two flip-flop circuits adapted to receive a clock signal.

5. The oscillator circuit of claim 4, wherein the control circuit includes a control input coupled to the at least two flip-flop circuits, for selectively placing the flip-flop circuits in one or more predetermined states when the control input is in a logic state.

6. The oscillator circuit of claim 4, wherein a first of the at least two flip-flop circuits includes an output coupled to an input of a second of the at least two flip-flop circuits.

7. The oscillator circuit of claim 1, wherein the oscillator circuit further comprises a current source for sourcing a current to or sinking a current from the crystal oscillator circuit, the current source having a control input that selectively controls a current level sourced to or sunk from the crystal oscillator circuit, the timer circuit comprises a timer having a clock input and being adapted to count a number of pulses of a signal appearing at the input of the timer, and an output of the timer being coupled to the control input of the current source.

8. The oscillator circuit of claim 7, wherein the current source comprises a current mirror having a first leg and a second leg coupled to the crystal oscillator circuit, a current level in the first leg being set based upon a value of the output of the timer.

9. The oscillator circuit of claim 7, wherein the current source includes a transistor having a control terminal coupled to the output of the timer, and a resistive component disposed in a current path to which current is sourced to or sunk from the crystal oscillator circuit, the transistor having conductive terminals coupled across the resistive component.

10. The oscillator circuit of claim 1, wherein the timer circuit is enabled to count following a power-up sequence.

11. The oscillator circuit of claim 1, wherein the timer circuit is enabled to count following the circuit switching to being powered by a battery source.

12. A method for generating an oscillating signal, comprising:
   generating, at a first current level, an output signal to oscillate between at least two voltage levels at around a predetermined frequency, each voltage level corresponding to a distinct logic state;
   receiving an input signal having a value indicative an occurrence of an event;
   counting at least a predetermined period of time following the input signal having the value indicative of the occurrence of the event, and
   generating, at a second current level different from the first current level, the output signal to oscillate at around the predetermined frequency.

13. The method of claim 12, wherein the event is a change in power supply.

14. The method of claim 12, further comprising receiving a clock signal, and the step of counting comprises counting a predetermined number of cycles of the clock signal.

15. The method of claim 14, wherein the input signal comprises a signal that resets at least one flip-flop circuit.

16. The method of claim 12, wherein the second current level is less than the first current level.

17. The method of claim 12, wherein the event is completion of a power-up sequence.

18. A system, comprising:
   circuitry responsive to at least one signal that oscillates at approximately a predetermined frequency; and
   oscillator circuitry adapted to generate the at least one signal at a first current and, subsequent to approximately a predetermined period of time after an occurrence of an event as measured by a timer circuit, at a second current level different from the first current level.

19. The system of claim 18, wherein the second current level is less than the first current level.

20. The system of claim 18, wherein the event is a power-up sequence.

21. The system of claim 18, wherein the event is power being supplied to the system from a battery.

22. The system of claim 18, wherein the timer circuit has at least two flip-flop circuits, the at least two flip-flop circuits having a control input for selectively placing the flip-flop circuits in one or more predetermined states.

23. The system of claim 22, wherein the at least two flip-flop circuits are selectively placed in a reset state based upon the value of the control input.

24. The system of claim 22, wherein the oscillator circuitry further comprises a crystal oscillator circuit and a current source coupled to the crystal oscillator circuit so as to source current to or sink current from the crystal oscillator circuit, a current level of the current source being based upon a state of an output of the timer circuit.

* * * * *